(12) United States Patent
Fish, Jr. et al.

(10) Patent No.: US 8,879,139 B2
(45) Date of Patent: Nov. 4, 2014

(54) DISPLAY MIRROR ASSEMBLY

(71) Applicant: Gentex Corporation, Zeeland, MI (US)

(72) Inventors: Richard T. Fish, Jr., Jenison, MI (US); Danny L. Minikey, Jr., Fenwick, MI (US); Bradley R. Hamlin, Allendale, MI (US); Ethan J. Lee, Byron Center, MI (US); Eric P. Kern, Holland, MI (US)

(73) Assignee: Gentex Corporation, Zeeland, MI (US)

( * ) Notice: Subject to any disclaimer, the term of this patent is extended or adjusted under 35 U.S.C. 154(b) by 47 days.

(21) Appl. No.: 13/830,806

(22) Filed: Mar. 14, 2013

(65) Prior Publication Data
US 2013/0279014 A1    Oct. 24, 2013

Related U.S. Application Data

(60) Provisional application No. 61/637,527, filed on Apr. 24, 2012, provisional application No. 61/764,341, filed on Feb. 13, 2013.

(51) Int. Cl.
*G02F 1/15* (2006.01)
*G02B 27/01* (2006.01)
*H05K 9/00* (2006.01)

(52) U.S. Cl.
CPC .......... *G02B 27/0149* (2013.01); *H05K 9/0054* (2013.01)
USPC ........................................................ 359/265

(58) Field of Classification Search
CPC ........................................................ G02F 1/15
USPC ........................... 359/265, 267, 268; 362/494
See application file for complete search history.

(56) References Cited

U.S. PATENT DOCUMENTS

| 2,131,888 | A | 10/1938 | Harris |
| 2,632,040 | A | 3/1953 | Rabinow |
| 2,827,594 | A | 3/1958 | Rabinow |
| 3,179,845 | A | 4/1965 | Kulwiec |

(Continued)

FOREIGN PATENT DOCUMENTS

| JP | 2005148119 | 6/2005 |
| JP | 2005327600 | 11/2005 |

OTHER PUBLICATIONS

International Searching Authority, Patent Cooperation Treaty, International Search Report and Written Opinion, Aug. 29, 2013, 6 pages.

(Continued)

*Primary Examiner* — Joseph P Martinez
(74) *Attorney, Agent, or Firm* — Price Heneveld LLP; Scott P. Ryan

(57) ABSTRACT

A display mirror assembly for a vehicle having a front shield including a first side and a second side. A partially reflective, partially transmissive element is mounted on the first side. A rear shield is disposed behind the front shield. A display module is mounted between the front shield and the rear shield and includes in order from the front shield: a display; an optic block; a heat sink having an edge lit PCB mounted along a top edge thereof; and a PCB. The front shield is secured to at least one component of the display module with a first retaining feature and the rear shield is secured to at least one component of the display module with a second retaining feature. A housing at least partially surrounds the front shield, display module, and rear shield.

20 Claims, 6 Drawing Sheets

(56) References Cited

U.S. PATENT DOCUMENTS

| | | | |
|---|---|---|---|
| 3,581,276 | A | 5/1971 | Newman |
| 3,663,819 | A | 5/1972 | Hicks et al. |
| 4,109,235 | A | 8/1978 | Bouthors |
| 4,139,801 | A | 2/1979 | Linares |
| 4,151,526 | A | 4/1979 | Hinachi et al. |
| 4,214,266 | A | 7/1980 | Myers |
| 4,236,099 | A | 11/1980 | Rosenblum |
| 4,257,703 | A | 3/1981 | Goodrich |
| 4,258,979 | A | 3/1981 | Mahin |
| 4,277,804 | A | 7/1981 | Robison |
| 4,286,308 | A | 8/1981 | Wolff |
| 4,310,851 | A | 1/1982 | Pierrat |
| 4,357,558 | A | 11/1982 | Massoni et al. |
| 4,376,909 | A | 3/1983 | Tagami et al. |
| 4,479,173 | A | 10/1984 | Rumpakis |
| 4,599,544 | A | 7/1986 | Martin |
| 4,638,287 | A | 1/1987 | Umebayashi et al. |
| 4,645,975 | A | 2/1987 | Meitzler et al. |
| 4,665,321 | A | 5/1987 | Chang et al. |
| 4,665,430 | A | 5/1987 | Hiroyasu |
| 4,692,798 | A | 9/1987 | Seko et al. |
| 4,716,298 | A | 12/1987 | Etoh |
| 4,727,290 | A | 2/1988 | Smith et al. |
| 4,740,838 | A | 4/1988 | Mase et al. |
| 4,768,135 | A | 8/1988 | Kretschmer et al. |
| 4,862,037 | A | 8/1989 | Farber et al. |
| 4,891,559 | A | 1/1990 | Matsumoto et al. |
| 4,910,591 | A | 3/1990 | Petrossian et al. |
| 4,930,742 | A | 6/1990 | Schofield et al. |
| 4,934,273 | A | 6/1990 | Endriz |
| 4,967,319 | A | 10/1990 | Seko |
| 5,005,213 | A | 4/1991 | Hanson et al. |
| 5,008,946 | A | 4/1991 | Ando |
| 5,027,200 | A | 6/1991 | Petrossian et al. |
| 5,036,437 | A | 7/1991 | Macks |
| 5,072,154 | A | 12/1991 | Chen |
| 5,086,253 | A | 2/1992 | Lawler |
| 5,096,287 | A | 3/1992 | Kakinami et al. |
| 5,121,200 | A | 6/1992 | Choi et al. |
| 5,124,549 | A | 6/1992 | Michaels et al. |
| 5,166,681 | A | 11/1992 | Bottesch et al. |
| 5,182,502 | A | 1/1993 | Slotkowski et al. |
| 5,187,383 | A | 2/1993 | Taccetta et al. |
| 5,197,562 | A | 3/1993 | Kakinami et al. |
| 5,230,400 | A | 7/1993 | Kakinami et al. |
| 5,235,178 | A | 8/1993 | Hegyi |
| 5,243,417 | A | 9/1993 | Pollard |
| 5,289,321 | A | 2/1994 | Secor |
| 5,296,924 | A | 3/1994 | Blancard et al. |
| 5,304,980 | A | 4/1994 | Maekawa |
| 5,329,206 | A | 7/1994 | Slotkowski et al. |
| 5,347,261 | A | 9/1994 | Adell |
| 5,347,459 | A | 9/1994 | Greenspan et al. |
| 5,355,146 | A | 10/1994 | Chiu et al. |
| 5,379,104 | A | 1/1995 | Takao |
| 5,386,285 | A | 1/1995 | Asayama |
| 5,396,054 | A | 3/1995 | Krichever et al. |
| 5,402,170 | A | 3/1995 | Parulski et al. |
| 5,408,357 | A | 4/1995 | Beukema |
| 5,414,461 | A | 5/1995 | Kishi et al. |
| 5,416,318 | A | 5/1995 | Hegyi |
| 5,418,610 | A | 5/1995 | Fischer |
| 5,424,952 | A | 6/1995 | Asayama |
| 5,426,294 | A | 6/1995 | Kobayashi et al. |
| 5,428,464 | A | 6/1995 | Silverbrook |
| 5,430,450 | A | 7/1995 | Holmes |
| 5,434,407 | A | 7/1995 | Bauer et al. |
| 5,451,822 | A | 9/1995 | Bechtel et al. |
| 5,452,004 | A | 9/1995 | Roberts |
| 5,469,298 | A | 11/1995 | Suman et al. |
| 5,471,515 | A | 11/1995 | Fossum et al. |
| 5,475,441 | A | 12/1995 | Parulski et al. |
| 5,475,494 | A | 12/1995 | Nishida et al. |
| 5,481,268 | A | 1/1996 | Higgins |
| 5,483,346 | A | 1/1996 | Butzer |
| 5,483,453 | A | 1/1996 | Uemura et al. |
| 5,485,155 | A | 1/1996 | Hibino |
| 5,485,378 | A | 1/1996 | Franke et al. |
| 5,488,496 | A | 1/1996 | Pine |
| 5,508,592 | A | 4/1996 | Lapatovich et al. |
| 5,515,448 | A | 5/1996 | Nishitani |
| 5,523,811 | A | 6/1996 | Wada et al. |
| 5,530,421 | A | 6/1996 | Marshall et al. |
| 5,535,144 | A | 7/1996 | Kise |
| 5,537,003 | A | 7/1996 | Bechtel et al. |
| 5,541,590 | A | 7/1996 | Nishio |
| 5,541,724 | A | 7/1996 | Hoashi |
| 5,550,677 | A | 8/1996 | Schofield et al. |
| 5,554,912 | A | 9/1996 | Thayer et al. |
| 5,574,443 | A | 11/1996 | Hsieh |
| 5,574,463 | A | 11/1996 | Shirai et al. |
| 5,576,975 | A | 11/1996 | Sasaki et al. |
| 5,587,929 | A | 12/1996 | League et al. |
| 5,592,146 | A | 1/1997 | Kover, Jr. et al. |
| 5,602,542 | A | 2/1997 | Widmann |
| 5,614,788 | A | 3/1997 | Mullins et al. |
| 5,615,023 | A | 3/1997 | Yang |
| 5,617,085 | A | 4/1997 | Tsutsumi et al. |
| 5,621,460 | A | 4/1997 | Hatlestad et al. |
| 5,634,709 | A | 6/1997 | Iwama |
| 5,642,238 | A | 6/1997 | Sala |
| 5,646,614 | A | 7/1997 | Abersfelder et al. |
| 5,650,765 | A | 7/1997 | Park |
| 5,660,454 | A | 8/1997 | Mori et al. |
| 5,666,028 | A | 9/1997 | Bechtel et al. |
| 5,670,935 | A | 9/1997 | Schofield et al. |
| 5,680,123 | A | 10/1997 | Lee |
| 5,684,473 | A | 11/1997 | Hibino et al. |
| 5,707,129 | A | 1/1998 | Kobayashi |
| 5,708,410 | A | 1/1998 | Blank et al. |
| 5,708,857 | A | 1/1998 | Ishibashi |
| 5,710,565 | A | 1/1998 | Shirai et al. |
| 5,714,751 | A | 2/1998 | Chen |
| 5,715,093 | A | 2/1998 | Schierbeek et al. |
| 5,729,194 | A | 3/1998 | Spears et al. |
| 5,736,816 | A | 4/1998 | Strenke et al. |
| 5,745,050 | A | 4/1998 | Nakagawa |
| 5,751,211 | A | 5/1998 | Shirai et al. |
| 5,751,832 | A | 5/1998 | Panter et al. |
| 5,754,099 | A | 5/1998 | Nishimura et al. |
| 5,760,828 | A | 6/1998 | Cortes |
| 5,764,139 | A | 6/1998 | Nojima et al. |
| 5,767,793 | A | 6/1998 | Agravante et al. |
| 5,781,105 | A | 7/1998 | Bitar et al. |
| 5,786,787 | A | 7/1998 | Eriksson et al. |
| 5,793,308 | A | 8/1998 | Rosinski et al. |
| 5,793,420 | A | 8/1998 | Schmidt |
| 5,796,094 | A | 8/1998 | Schofield et al. |
| 5,798,727 | A | 8/1998 | Shirai et al. |
| 5,811,888 | A | 9/1998 | Hsieh |
| 5,812,321 | A | 9/1998 | Schierbeek et al. |
| 5,837,994 | A | 11/1998 | Stam et al. |
| 5,841,126 | A | 11/1998 | Fossum et al. |
| 5,844,505 | A | 12/1998 | Van Ryzin |
| 5,845,000 | A | 12/1998 | Breed et al. |
| 5,850,176 | A | 12/1998 | Kinoshita et al. |
| 5,867,214 | A | 2/1999 | Anderson et al. |
| 5,877,897 | A | 3/1999 | Schofield et al. |
| 5,883,739 | A | 3/1999 | Ashihara et al. |
| 5,904,729 | A | 5/1999 | Ruzicka |
| 5,905,457 | A | 5/1999 | Rashid |
| 5,912,534 | A | 6/1999 | Benedict |
| 5,923,027 | A | 7/1999 | Stam et al. |
| 5,935,613 | A | 8/1999 | Benham et al. |
| 5,940,011 | A | 8/1999 | Agravante et al. |
| 5,942,853 | A | 8/1999 | Piscart |
| 5,949,331 | A | 9/1999 | Schofield et al. |
| 5,956,079 | A | 9/1999 | Ridgley |
| 5,956,181 | A | 9/1999 | Lin |
| 5,959,555 | A | 9/1999 | Furuta |
| 5,990,469 | A | 11/1999 | Bechtel et al. |
| 6,008,486 | A | 12/1999 | Stam et al. |
| 6,009,359 | A | 12/1999 | El-Hakim et al. |
| 6,018,308 | A | 1/2000 | Shirai |

(56) References Cited

U.S. PATENT DOCUMENTS

| | | |
|---|---|---|
| 6,025,872 A | 2/2000 | Ozaki et al. |
| 6,046,766 A | 4/2000 | Sakata |
| 6,049,171 A | 4/2000 | Stam et al. |
| 6,060,989 A | 5/2000 | Gehlot |
| 6,061,002 A | 5/2000 | Weber et al. |
| 6,067,111 A | 5/2000 | Hahn et al. |
| 6,072,391 A | 6/2000 | Suzuki et al. |
| 6,078,355 A | 6/2000 | Zengel |
| 6,097,023 A | 8/2000 | Schofield et al. |
| 6,102,546 A | 8/2000 | Carter |
| 6,106,121 A | 8/2000 | Buckley et al. |
| 6,111,498 A | 8/2000 | Jobes et al. |
| 6,115,651 A | 9/2000 | Cruz |
| 6,122,597 A | 9/2000 | Saneyoshi et al. |
| 6,128,576 A | 10/2000 | Nishimoto et al. |
| 6,130,421 A | 10/2000 | Bechtel et al. |
| 6,130,448 A | 10/2000 | Bauer et al. |
| 6,140,933 A | 10/2000 | Bugno et al. |
| 6,144,158 A | 11/2000 | Beam |
| 6,151,065 A | 11/2000 | Steed et al. |
| 6,151,539 A | 11/2000 | Bergholz et al. |
| 6,154,149 A | 11/2000 | Tyckowski et al. |
| 6,157,294 A | 12/2000 | Urai et al. |
| 6,166,629 A | 12/2000 | Hamma et al. |
| 6,166,698 A | 12/2000 | Turnbull et al. |
| 6,167,755 B1 | 1/2001 | Damson et al. |
| 6,172,600 B1 | 1/2001 | Kakinami et al. |
| 6,172,601 B1 | 1/2001 | Wada et al. |
| 6,175,300 B1 | 1/2001 | Kendrick |
| 6,184,781 B1 | 2/2001 | Ramakesavan |
| 6,185,492 B1 | 2/2001 | Kagawa et al. |
| 6,191,704 B1 | 2/2001 | Takenaga et al. |
| 6,200,010 B1 | 3/2001 | Anders |
| 6,218,934 B1 | 4/2001 | Regan |
| 6,222,447 B1 | 4/2001 | Schofield et al. |
| 6,249,214 B1 | 6/2001 | Kashiwazaki |
| 6,250,766 B1 | 6/2001 | Strumolo et al. |
| 6,255,639 B1 | 7/2001 | Stam et al. |
| 6,259,475 B1 | 7/2001 | Ramachandran et al. |
| 6,265,968 B1 | 7/2001 | Betzitza et al. |
| 6,268,803 B1 | 7/2001 | Gunderson et al. |
| 6,269,308 B1 | 7/2001 | Kodaka et al. |
| 6,281,632 B1 | 8/2001 | Stam et al. |
| 6,281,804 B1 | 8/2001 | Haller et al. |
| 6,289,332 B2 | 9/2001 | Menig et al. |
| 6,300,879 B1 | 10/2001 | Regan et al. |
| 6,304,173 B2 | 10/2001 | Pala et al. |
| 6,317,057 B1 | 11/2001 | Lee |
| 6,320,612 B1 | 11/2001 | Young |
| 6,324,295 B1 | 11/2001 | Valery et al. |
| 6,329,925 B1 | 12/2001 | Skiver et al. |
| 6,330,511 B2 | 12/2001 | Ogura et al. |
| 6,335,680 B1 | 1/2002 | Matsuoka |
| 6,344,805 B1 | 2/2002 | Yasui et al. |
| 6,348,858 B2 | 2/2002 | Weis et al. |
| 6,349,782 B1 | 2/2002 | Sekiya et al. |
| 6,356,206 B1 | 3/2002 | Takenaga et al. |
| 6,356,376 B1 | 3/2002 | Tonar et al. |
| 6,357,883 B1 | 3/2002 | Strumolo et al. |
| 6,363,326 B1 | 3/2002 | Scully |
| 6,379,013 B1 | 4/2002 | Bechtel et al. |
| 6,396,040 B1 | 5/2002 | Hill |
| 6,396,397 B1 | 5/2002 | Bos et al. |
| 6,403,942 B1 | 6/2002 | Stam |
| 6,408,247 B1 | 6/2002 | Ichikawa et al. |
| 6,412,959 B1 | 7/2002 | Tseng |
| 6,415,230 B1 | 7/2002 | Maruko et al. |
| 6,421,081 B1 | 7/2002 | Markus |
| 6,424,272 B1 | 7/2002 | Gutta et al. |
| 6,424,273 B1 | 7/2002 | Gutta et al. |
| 6,424,892 B1 | 7/2002 | Matsuoka |
| 6,428,172 B1 | 8/2002 | Hutzel et al. |
| 6,433,680 B1 | 8/2002 | Ho |
| 6,437,688 B1 | 8/2002 | Kobayashi |
| 6,438,491 B1 | 8/2002 | Farmer |
| 6,441,872 B1 | 8/2002 | Ho |
| 6,442,465 B2 | 8/2002 | Breed et al. |
| 6,443,602 B1 | 9/2002 | Tanabe et al. |
| 6,447,128 B1 | 9/2002 | Lang et al. |
| 6,452,533 B1 | 9/2002 | Yamabuchi et al. |
| 6,463,369 B2 | 10/2002 | Sadano et al. |
| 6,465,962 B1 | 10/2002 | Fu et al. |
| 6,466,701 B1 | 10/2002 | Ejiri et al. |
| 6,469,739 B1 | 10/2002 | Bechtel et al. |
| 6,472,977 B1 | 10/2002 | Pochmuller |
| 6,473,001 B1 | 10/2002 | Blum |
| 6,476,731 B1 | 11/2002 | Miki et al. |
| 6,483,429 B1 | 11/2002 | Yasui et al. |
| 6,483,438 B2 | 11/2002 | DeLine et al. |
| 6,487,500 B2 | 11/2002 | Lemelson et al. |
| 6,491,416 B1 | 12/2002 | Strazzanti |
| 6,498,620 B2 | 12/2002 | Schofield et al. |
| 6,501,387 B2 | 12/2002 | Skiver et al. |
| 6,507,779 B2 | 1/2003 | Breed et al. |
| 6,515,581 B1 | 2/2003 | Ho |
| 6,515,597 B1 | 2/2003 | Wada et al. |
| 6,520,667 B1 | 2/2003 | Mousseau |
| 6,522,969 B2 | 2/2003 | Kannonji |
| 6,542,085 B1 | 4/2003 | Yang |
| 6,542,182 B1 | 4/2003 | Chutorash |
| 6,545,598 B1 | 4/2003 | De Villeroche |
| 6,550,943 B2 | 4/2003 | Strazzanti |
| 6,553,130 B1 | 4/2003 | Lemelson et al. |
| 6,558,026 B2 | 5/2003 | Strazzanti |
| 6,572,233 B1 | 6/2003 | Northman et al. |
| 6,575,643 B2 | 6/2003 | Takahashi |
| 6,580,373 B1 | 6/2003 | Ohashi |
| 6,581,007 B2 | 6/2003 | Hasegawa et al. |
| 6,583,730 B2 | 6/2003 | Lang et al. |
| 6,587,573 B1 | 7/2003 | Stam et al. |
| 6,591,192 B2 | 7/2003 | Okamura et al. |
| 6,594,583 B2 | 7/2003 | Ogura et al. |
| 6,594,614 B2 | 7/2003 | Studt et al. |
| 6,611,202 B2 | 8/2003 | Schofield et al. |
| 6,611,227 B1 | 8/2003 | Nebiyeloul-Kifle |
| 6,611,610 B1 | 8/2003 | Stam et al. |
| 6,611,759 B2 | 8/2003 | Brosche |
| 6,614,387 B1 | 9/2003 | Deadman |
| 6,616,764 B2 | 9/2003 | Kramer et al. |
| 6,617,564 B2 | 9/2003 | Ockerse et al. |
| 6,618,672 B2 | 9/2003 | Sasaki et al. |
| 6,630,888 B2 | 10/2003 | Lang et al. |
| 6,631,316 B2 | 10/2003 | Stam et al. |
| 6,636,258 B2 | 10/2003 | Strumolo |
| 6,642,840 B2 | 11/2003 | Lang et al. |
| 6,642,851 B2 | 11/2003 | Deline et al. |
| 6,648,477 B2 | 11/2003 | Hutzel et al. |
| 6,665,592 B2 | 12/2003 | Kodama |
| 6,670,207 B1 | 12/2003 | Roberts |
| 6,670,910 B2 | 12/2003 | Delcheccolo et al. |
| 6,674,370 B2 | 1/2004 | Rodewald et al. |
| 6,675,075 B1 | 1/2004 | Engelsberg et al. |
| 6,677,986 B1 | 1/2004 | Pöchmüller |
| 6,683,539 B2 | 1/2004 | Trajkovic et al. |
| 6,683,969 B1 | 1/2004 | Nishigaki et al. |
| 6,690,268 B2 | 2/2004 | Schofield et al. |
| 6,690,413 B1 | 2/2004 | Moore |
| 6,693,517 B2 | 2/2004 | McCarthy et al. |
| 6,693,518 B2 | 2/2004 | Kumata |
| 6,693,519 B2 | 2/2004 | Keirstead |
| 6,693,524 B1 | 2/2004 | Payne |
| 6,717,610 B1 | 4/2004 | Bos et al. |
| 6,727,808 B1 | 4/2004 | Uselmann et al. |
| 6,727,844 B1 | 4/2004 | Zimmermann et al. |
| 6,731,332 B1 | 5/2004 | Yasui et al. |
| 6,734,807 B2 | 5/2004 | King |
| 6,737,964 B2 | 5/2004 | Samman et al. |
| 6,738,088 B1 | 5/2004 | Uskolovsky et al. |
| 6,744,353 B2 | 6/2004 | Sjonell |
| 6,772,057 B2 | 8/2004 | Breed et al. |
| 6,774,988 B2 | 8/2004 | Stam et al. |
| 6,846,098 B2 | 1/2005 | Bourdelais et al. |
| 6,847,487 B2 | 1/2005 | Burgner |
| 6,861,809 B2 | 3/2005 | Stam |

(56) References Cited

U.S. PATENT DOCUMENTS

| | | |
|---|---|---|
| 6,902,307 B2 | 6/2005 | Strazzanti |
| 6,913,375 B2 | 7/2005 | Strazzanti |
| 6,930,737 B2 | 8/2005 | Weindorf et al. |
| 6,946,978 B2 | 9/2005 | Schofield |
| 7,012,543 B2 | 3/2006 | DeLine et al. |
| 7,038,577 B2 | 5/2006 | Pawlicki et al. |
| 7,046,448 B2 | 5/2006 | Burgner |
| 7,175,291 B1 | 2/2007 | Li |
| 7,255,465 B2 | 8/2007 | DeLine et al. |
| 7,262,406 B2 | 8/2007 | Heslin et al. |
| 7,265,342 B2 | 9/2007 | Heslin et al. |
| 7,292,208 B1 | 11/2007 | Park et al. |
| 7,311,428 B2 | 12/2007 | DeLine et al. |
| 7,321,112 B2 | 1/2008 | Stam et al. |
| 7,417,221 B2 | 8/2008 | Creswick et al. |
| 7,446,650 B2 | 11/2008 | Scholfield et al. |
| 7,467,883 B2 | 12/2008 | DeLine et al. |
| 7,468,651 B2 | 12/2008 | DeLine et al. |
| 7,533,998 B2 | 5/2009 | Schofield et al. |
| 7,548,291 B2 | 6/2009 | Lee et al. |
| 7,565,006 B2 | 7/2009 | Stam et al. |
| 7,567,291 B2 | 7/2009 | Bechtel et al. |
| 7,579,940 B2 * | 8/2009 | Schofield et al. .......... 340/425.5 |
| 7,653,215 B2 | 1/2010 | Stam |
| 7,658,521 B2 | 2/2010 | DeLine et al. |
| 7,683,326 B2 | 3/2010 | Stam et al. |
| 7,719,408 B2 | 5/2010 | DeWard et al. |
| 7,720,580 B2 | 5/2010 | Higgins-Luthman |
| 7,815,326 B2 | 10/2010 | Blank et al. |
| 7,877,175 B2 | 1/2011 | Higgins-Luthman |
| 7,881,839 B2 | 2/2011 | Stam et al. |
| 7,888,629 B2 | 2/2011 | Heslin et al. |
| 7,914,188 B2 | 3/2011 | DeLine et al. |
| 7,972,045 B2 | 7/2011 | Schofield |
| 7,994,471 B2 | 8/2011 | Heslin et al. |
| 8,045,760 B2 | 10/2011 | Stam et al. |
| 8,059,235 B2 | 11/2011 | Utsumi et al. |
| 8,063,753 B2 | 11/2011 | Deline et al. |
| 8,090,153 B2 | 1/2012 | Schofield et al. |
| 8,100,568 B2 | 1/2012 | Deline et al. |
| 8,116,929 B2 | 2/2012 | Higgins-Luthman |
| 8,120,652 B2 | 2/2012 | Bechtel et al. |
| 8,142,059 B2 | 3/2012 | Higgins-Luthman et al. |
| 8,162,518 B2 | 4/2012 | Schofield |
| 8,201,800 B2 | 6/2012 | Filipiak |
| 8,203,433 B2 | 6/2012 | Deuber et al. |
| 8,217,830 B2 | 7/2012 | Lynam |
| 8,222,588 B2 | 7/2012 | Schofield et al. |
| 8,237,909 B2 | 8/2012 | Ostreko et al. |
| 8,258,433 B2 | 9/2012 | Byers et al. |
| 8,325,028 B2 | 12/2012 | Schofield et al. |
| 8,482,683 B2 | 7/2013 | Hwang et al. |
| 2001/0019356 A1 | 9/2001 | Takeda et al. |
| 2001/0022616 A1 | 9/2001 | Rademacher et al. |
| 2001/0026316 A1 | 10/2001 | Senatore |
| 2001/0045981 A1 | 11/2001 | Gloger et al. |
| 2002/0040962 A1 | 4/2002 | Schofield et al. |
| 2002/0044065 A1 | 4/2002 | Quist et al. |
| 2002/0191127 A1 | 12/2002 | Roberts et al. |
| 2003/0002165 A1 | 1/2003 | Mathias et al. |
| 2003/0007261 A1 | 1/2003 | Hutzel et al. |
| 2003/0016125 A1 | 1/2003 | Lang et al. |
| 2003/0016287 A1 | 1/2003 | Nakayama et al. |
| 2003/0025596 A1 | 2/2003 | Lang et al. |
| 2003/0025597 A1 | 2/2003 | Schofield |
| 2003/0030546 A1 | 2/2003 | Tseng |
| 2003/0030551 A1 | 2/2003 | Ho |
| 2003/0030724 A1 | 2/2003 | Okamoto |
| 2003/0035050 A1 | 2/2003 | Mizusawa |
| 2003/0043269 A1 | 3/2003 | Park |
| 2003/0052969 A1 | 3/2003 | Satoh et al. |
| 2003/0058338 A1 | 3/2003 | Kawauchi et al. |
| 2003/0067383 A1 | 4/2003 | Yang |
| 2003/0076415 A1 | 4/2003 | Strumolo |
| 2003/0080877 A1 | 5/2003 | Takagi et al. |
| 2003/0085806 A1 | 5/2003 | Samman et al. |
| 2003/0088361 A1 | 5/2003 | Sekiguchi |
| 2003/0090568 A1 | 5/2003 | Pico |
| 2003/0090569 A1 | 5/2003 | Poechmueller |
| 2003/0090570 A1 | 5/2003 | Takagi et al. |
| 2003/0098908 A1 | 5/2003 | Misaiji et al. |
| 2003/0103141 A1 | 6/2003 | Bechtel et al. |
| 2003/0103142 A1 | 6/2003 | Hitomi et al. |
| 2003/0117522 A1 | 6/2003 | Okada |
| 2003/0122929 A1 | 7/2003 | Minaudo et al. |
| 2003/0122930 A1 | 7/2003 | Schofield et al. |
| 2003/0133014 A1 | 7/2003 | Mendoza |
| 2003/0137586 A1 | 7/2003 | Lewellen |
| 2003/0141965 A1 | 7/2003 | Gunderson et al. |
| 2003/0146831 A1 | 8/2003 | Berberich et al. |
| 2003/0169158 A1 | 9/2003 | Paul, Jr. |
| 2003/0179293 A1 | 9/2003 | Oizumi |
| 2003/0202096 A1 | 10/2003 | Kim |
| 2003/0202357 A1 | 10/2003 | Strazzanti |
| 2003/0214576 A1 | 11/2003 | Koga |
| 2003/0214584 A1 | 11/2003 | Ross, Jr. |
| 2003/0214733 A1 | 11/2003 | Fujikawa et al. |
| 2003/0222793 A1 | 12/2003 | Tanaka et al. |
| 2003/0222983 A1 | 12/2003 | Nobori et al. |
| 2003/0227546 A1 | 12/2003 | Hilborn et al. |
| 2004/0004541 A1 | 1/2004 | Hong |
| 2004/0027695 A1 | 2/2004 | Lin |
| 2004/0032321 A1 | 2/2004 | McMahon et al. |
| 2004/0036768 A1 | 2/2004 | Green |
| 2004/0051634 A1 | 3/2004 | Schofield et al. |
| 2004/0056955 A1 | 3/2004 | Berberich et al. |
| 2004/0057131 A1 | 3/2004 | Hutzel et al. |
| 2004/0064241 A1 | 4/2004 | Sekiguchi |
| 2004/0066285 A1 | 4/2004 | Sekiguchi |
| 2004/0075603 A1 | 4/2004 | Kodama |
| 2004/0080404 A1 | 4/2004 | White |
| 2004/0080431 A1 | 4/2004 | White |
| 2004/0085196 A1 | 5/2004 | Miller et al. |
| 2004/0090314 A1 | 5/2004 | Iwamoto |
| 2004/0090317 A1 | 5/2004 | Rothkop |
| 2004/0096082 A1 | 5/2004 | Nakai et al. |
| 2004/0098196 A1 | 5/2004 | Sekiguchi |
| 2004/0107030 A1 | 6/2004 | Nishira et al. |
| 2004/0107617 A1 | 6/2004 | Shoen et al. |
| 2004/0109060 A1 | 6/2004 | Ishii |
| 2004/0114039 A1 | 6/2004 | Ishikura |
| 2004/0119668 A1 | 6/2004 | Homma et al. |
| 2004/0125905 A1 | 7/2004 | Vlasenko et al. |
| 2004/0202001 A1 | 10/2004 | Roberts et al. |
| 2005/0140855 A1 | 6/2005 | Utsumi |
| 2005/0237440 A1 | 10/2005 | Sugimura et al. |
| 2006/0007550 A1 | 1/2006 | Tonar et al. |
| 2006/0115759 A1 | 6/2006 | Kim et al. |
| 2006/0139953 A1 | 6/2006 | Chou et al. |
| 2006/0158899 A1 | 7/2006 | Ayabe et al. |
| 2007/0171037 A1 | 7/2007 | Schofield et al. |
| 2008/0192132 A1 | 8/2008 | Bechtel et al. |
| 2008/0294315 A1 | 11/2008 | Breed |
| 2009/0015736 A1 | 1/2009 | Weller et al. |
| 2009/0141516 A1 | 6/2009 | Wu et al. |
| 2013/0028473 A1 | 1/2013 | Hilldore et al. |

OTHER PUBLICATIONS

Palalau et al., "FPD Evaluation for Automotive Application," Proceedings of the Vehicle Display Symposium, Nov. 2, 1995, pp. 97-103, Society for Information Display, Detroit Chapter, Santa Ana, CA.

Adler, "A New Automotive AMLCD Module," Proceedings of the Vehicle Display Symposium, Nov. 2, 1995, pp. 67-71, Society for Information Display, Detroit Chapter, Santa Ana, CA.

Sayer, et al., "In-Vehicle Displays for Crash Avoidance and Navigation Systems,"Proceedings of the Vehicle Display Symposium, Sep. 18, 1996, pp. 39-42, Society for Information Display, Detroit Chapter, Santa Ana, CA.

Knoll, et al., "Application of Graphic Displays in Automobiles," SID 87 Digest, 1987, pp. 41-44, 5A.2.

(56) References Cited

OTHER PUBLICATIONS

Terada, et al., "Development of Central Information Display of Automotive Application," SID 89 Digest, 1989, pp. 192-195, Society for Information Display, Detroit Center, Santa Ana, CA.

Thomsen, et al., "AMLCD Design Considerations for Avionics and Vetronics Applications," Proceedings of the 5th Annual Flat Panel Display Strategic and Technical Symposium, Sep. 9-10, 1998, pp. 139-145, Society for Information Display, Metropolitan Detroit Chapter, CA.

Knoll, et al., "Conception of an Integrated Driver Information System," SID International Symposium Digest of Technical Papers, 1990, pp. 126-129, Society for Information Display, Detroit Center, Santa Ana, CA.

Vincen, "An Analysis of Direct-View FPDs for Automotive Multi-Media Applications,"Proceedings of the 6th Annual Strategic and Technical Symposium "Vehicular Applications of Displays and Microsensors," Sep. 22-23, 1999, pp. 39-46, Society for Information Display, Metropolitan Detroit Chapter, San Jose, CA.

Zuk, et al., "Flat Panel Display Applications in Agriculture Equipment," Proceedings of the 5th Annual Flat Panel Display Strategic and Technical Symposium, Sep. 9-10, 1998, pp. 125-130, Society for Information Display, Metropolitan Detroit Chapter, CA.

Vijan, et al., "A 1.7-Mpixel Full-Color Diode Driven AM-LCD," SID International Symposium, 1990, pp. 530-533, Society for Information Display, Playa del Rey, CA.

Vincen, "The Automotive Challenge to Active Matrix LCD Technology," Proceedings of the Vehicle Display Symposium, 1996, pp. 17-21, Society for Information Display, Detroit Center, Santa Ana, CA.

Corsi, et al, "Reconfigurable Displays Used as Primary Automotive Instrumentation," SAE Technical Paper Series, 1989, pp. 13-18, Society of Automotive Engineers, Inc., Warrendale, PA.

Schumacher, "Automotive Display Trends," SID 96 Digest, 1997, pp. 1-6, Delco Electronics Corp., Kokomo, IN.

Knoll, "The Use of Displays in Automotive Applications," Journal of the SID 5/3 1997, pp. 165-172, 315-316, Stuttgart, Germany.

Donofrio, "Looking Beyond the Dashboard," SID 2002, pp. 30-34, Ann Arbor, MI.

Stone, "Automotive Display Specification," Proceedings of the Vehicle Display Symposium, 1995, pp. 93-96, Society for Information Display, Detroit Center, Santa Ana, CA.

* cited by examiner

DISPLAY MIRROR ASSEMBLY

CROSS-REFERENCE TO RELATED APPLICATIONS

This application claims priority under 35 U.S.C. §119(e) to U.S. Provisional Patent Application No. 61/637,527, filed on Apr. 24, 2012 entitled "DISPLAY MIRROR SYSTEM," and U.S. Provisional Patent Application No. 61/764,341, filed on Feb. 13, 2013, entitled "DISPLAY MIRROR SYSTEM," which are herein incorporated by reference in their entirety.

BACKGROUND OF THE INVENTION

The present invention generally relates to a rearview device system, and more particularly, a display mirror assembly having a partially reflective, partially transmissive element and a display behind the reflective element.

SUMMARY OF THE INVENTION

One aspect of the invention includes a display mirror assembly for a vehicle having a front shield including a first side and a second side. A partially reflective, partially transmissive element is mounted on the first side. A rear shield is disposed behind the front shield. A display module is mounted between the front shield and the rear shield and includes in order from the front shield: a display; an optic block; a heat sink having an edge lit PCB mounted along a top edge thereof; and a PCB. The front shield is secured to at least one component of the display module with a first retaining feature and the rear shield is secured to at least one component of the display module with a second retaining feature. A housing at least partially surrounds the front shield, display module, and rear shield.

Another aspect of the invention includes an RF shield for a display mirror having a first metallic shield member with RF shielding properties. The first metallic shield member forms a carrier plate having structural features configured to support a display module. A second metallic shield member includes RF shielding properties. The first metallic shield member and the second metallic shield member each have retaining features to operatively engage the display module disposed between the first metallic shield member and the second metallic shield member.

Still another aspect of the invention includes a method of manufacturing a display mirror assembly for a vehicle. A partially reflective, partially transmissive element is affixed to a front side of a front shield. A display module is positioned on a rear side of the front shield and the front shield is operably secured to the display module. A rear shield is positioned on a rear side of the display module the rear shield is operably secured to the display module. The front shield, the display module, and the rear shield are operably secured between a glass element and a rear housing in a carrier plate free configuration.

These and other features, advantages, and objects of the present invention will be further understood and appreciated by those skilled in the art by reference to the following specification, claims, and appended drawings.

DETAILED DESCRIPTION

Figure 1:
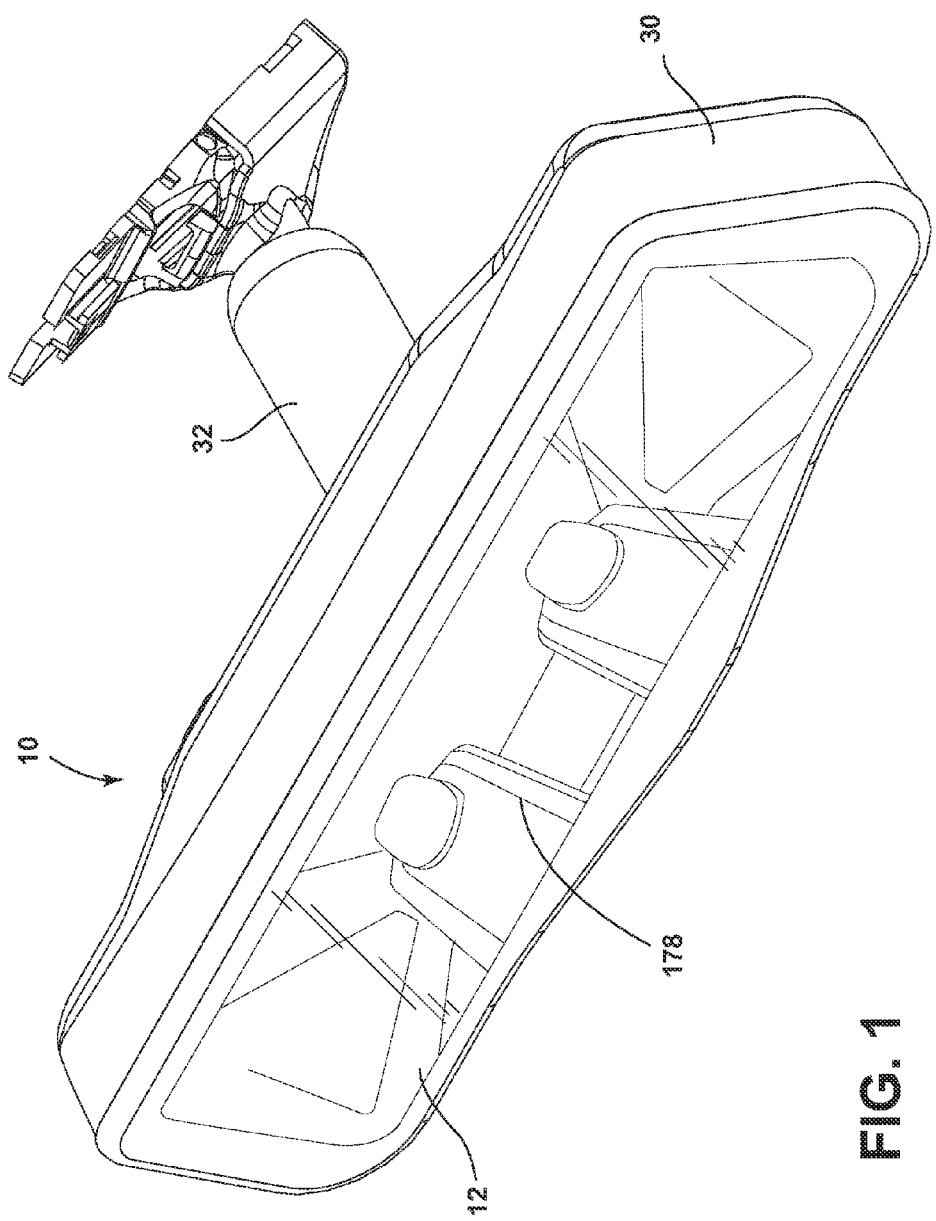
FIG. 1 is a top front perspective view of a display mirror assembly for a vehicle.

The present illustrated embodiments reside primarily in combinations of method steps and apparatus components related to a display mirror. Accordingly, the apparatus components and method steps have been represented, where appropriate, by conventional symbols in the drawings, showing only those specific details that are pertinent to understanding the embodiments of the present invention so as not to obscure the disclosure with details that will be readily apparent to those of ordinary skill in the art having the benefit of the description herein. Further, like numerals in the description and drawings represent like elements.

For purposes of description herein, the terms "upper," "lower," "right," "left," "rear," "front," "vertical," "horizontal," and derivatives thereof shall relate to the invention as oriented in FIG. 1. Unless stated otherwise, the term "front" shall refer to the surface of the element closer to an intended viewer of the display mirror, and the term "rear" shall refer to the surface of the element further from the intended viewer of the display mirror. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a . . . " does not, without more constraints, preclude the existence of additional identical elements in the process, method, article, or apparatus that comprises the element.

Figure 2:
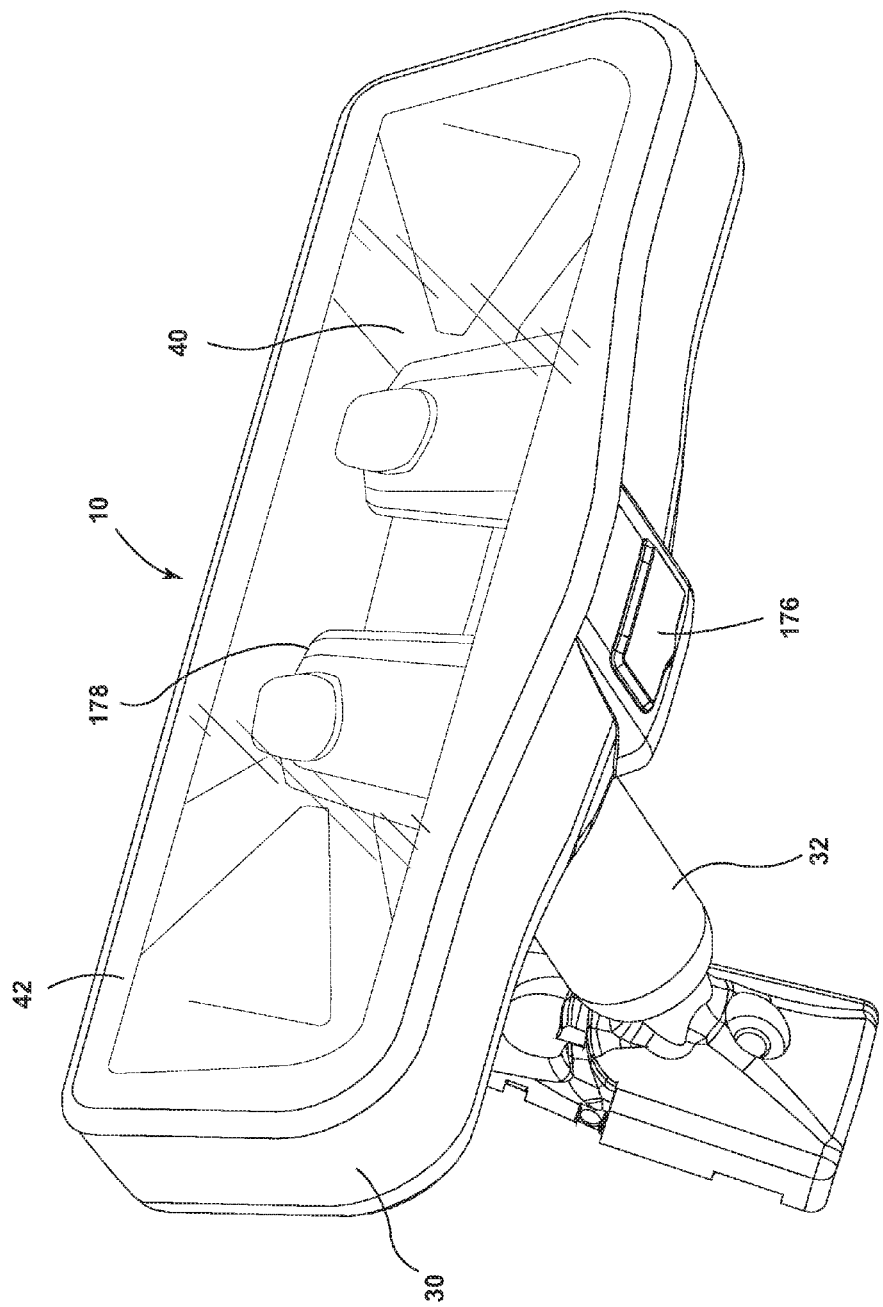
FIG. 2 is a bottom front perspective view of the display mirror assembly of FIG. 1.
Figure 3:
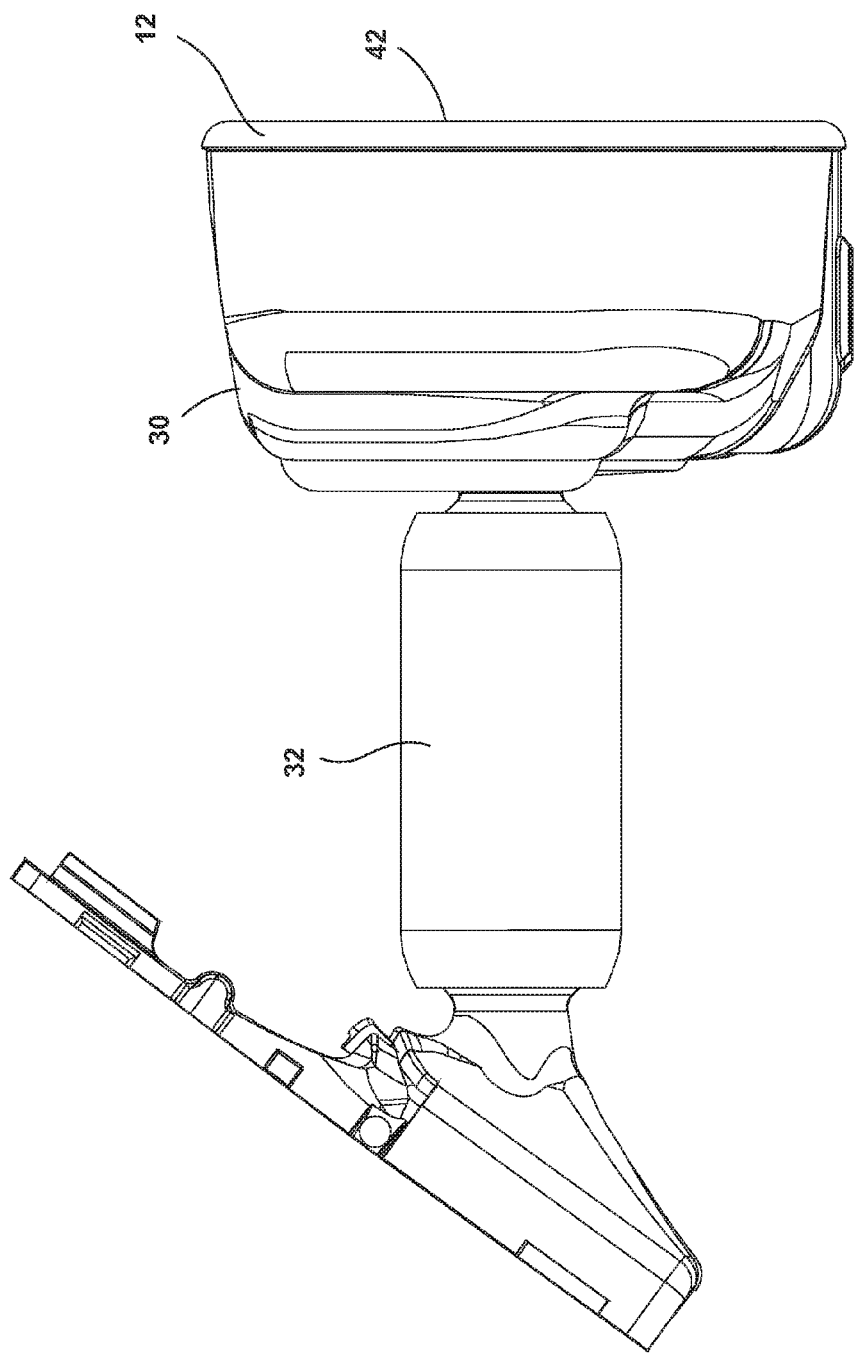
FIG. 3 is a side elevation view of the display mirror assembly of FIG. 1.
Figure 4:
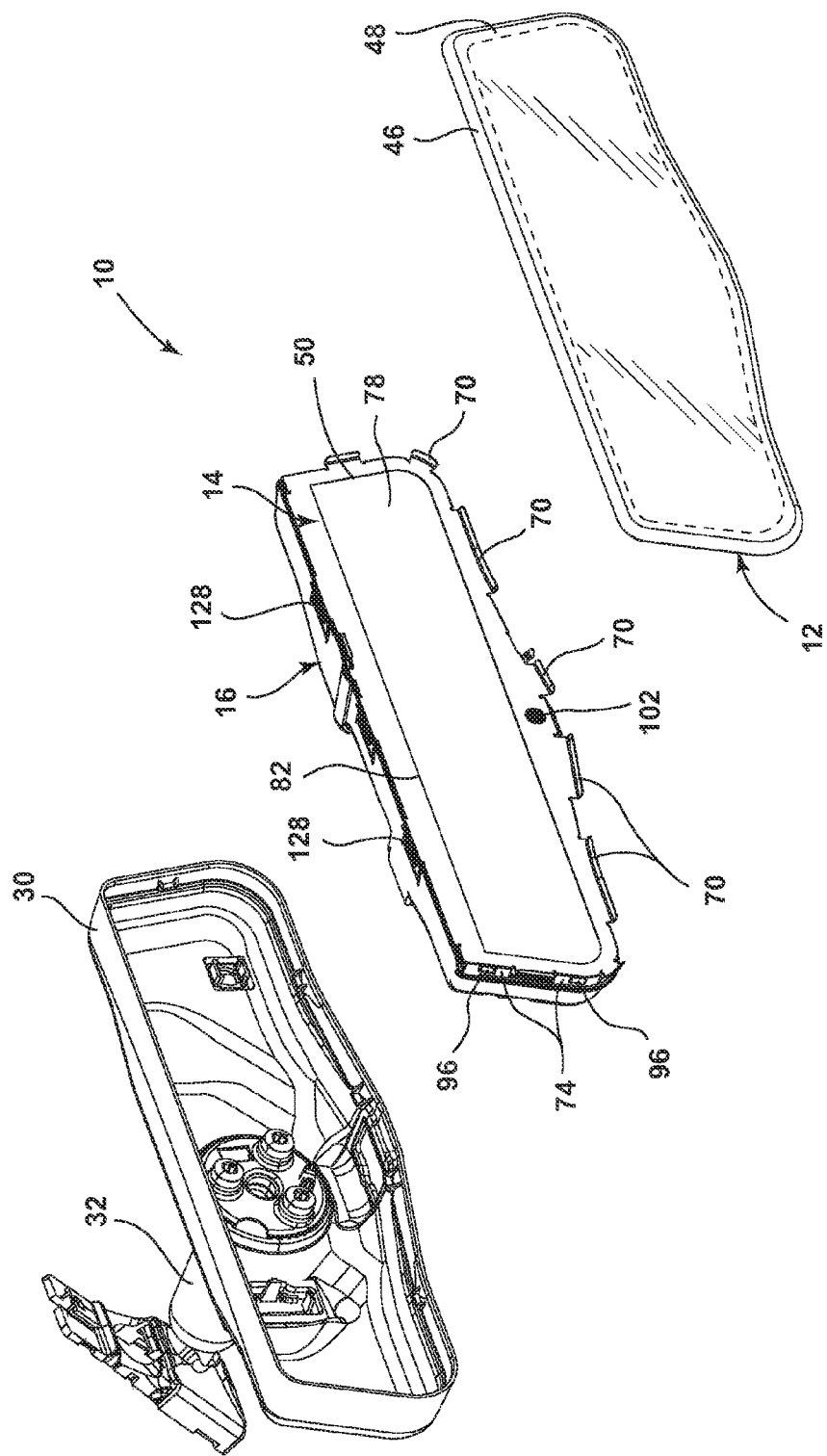
FIG. 4 is a partially exploded top perspective view of the display mirror assembly of FIG. 1.
Figure 5:
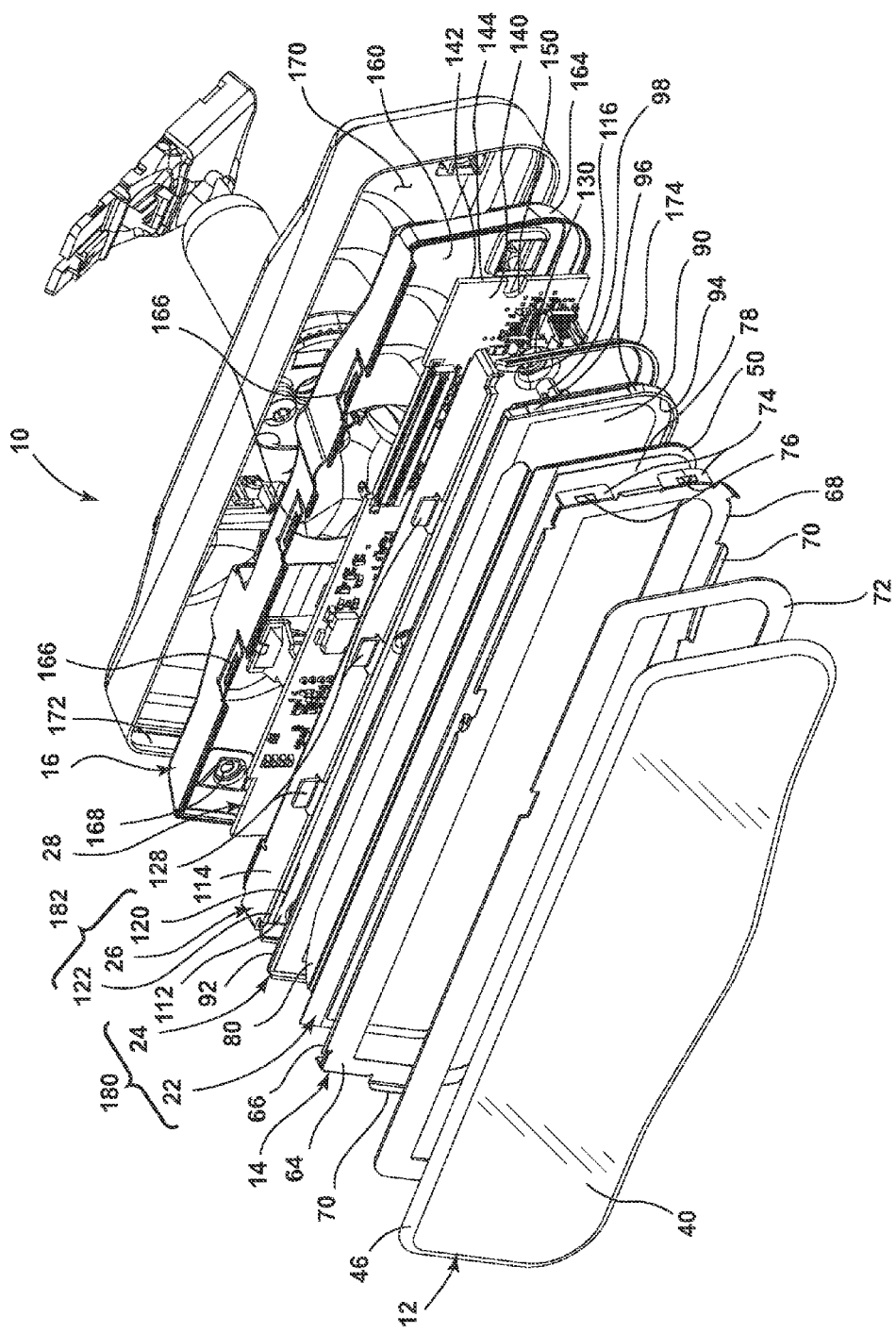
FIG. 5 is a partially exploded top perspective view of the display mirror assembly of FIG. 1.
Figure 6:
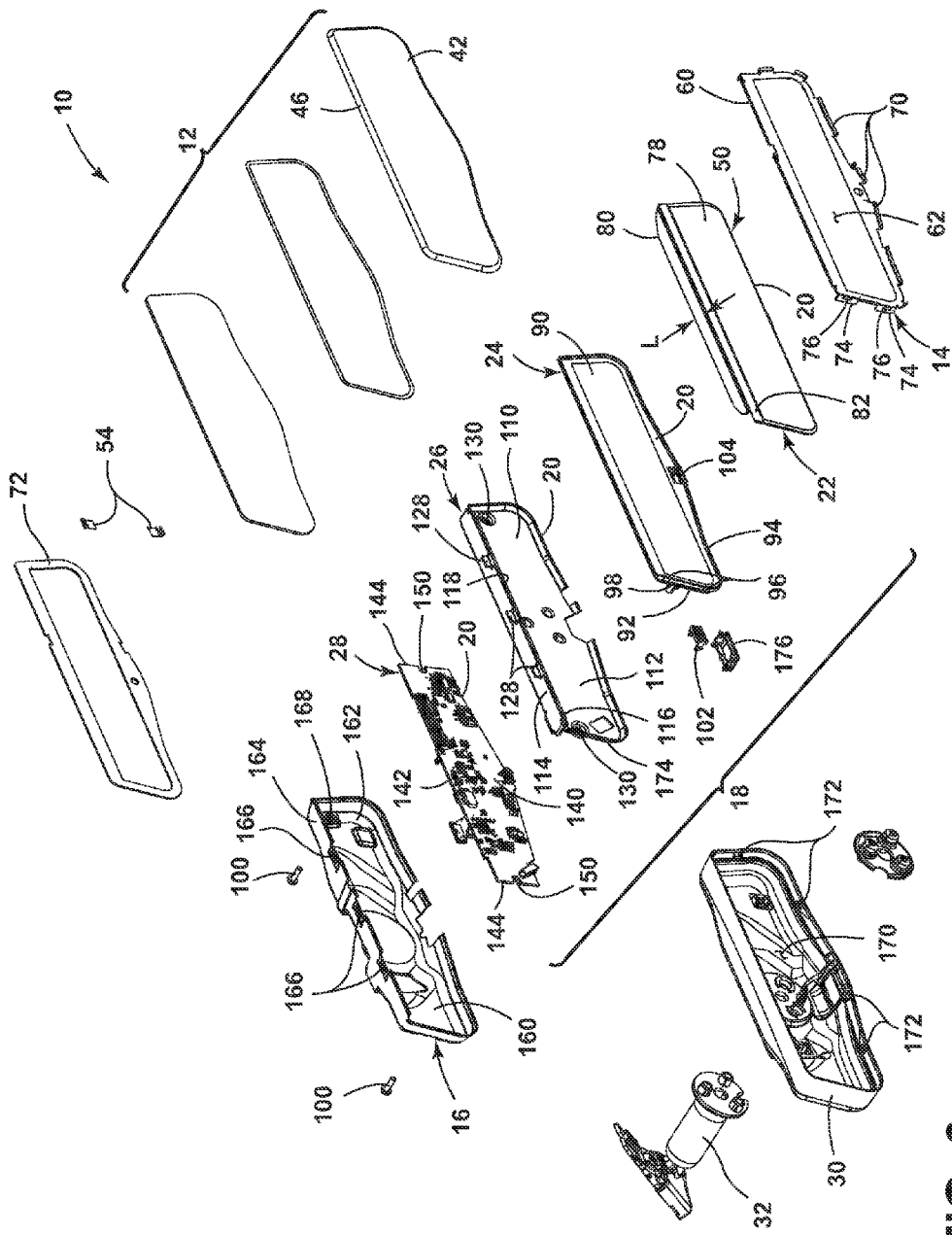
FIG. 6 is an exploded top perspective view of the display mirror assembly of FIG. 1.

Referring now to FIGS. 1-3, reference numeral 10 generally designates a display mirror assembly for a vehicle. The display mirror assembly 10 includes a partially reflective, partially transmissive element 12 (also referred to as a "glass element" herein) and a display module 18 (FIG. 6) that is viewed through the partially reflective, partially transmissive element 12. As shown in FIG. 4, the display mirror assembly 10 further includes a front shield 14 and a rear shield 16 which shield and support the partially reflective, partially transmissive element 12 and the display module 18 (FIG. 6). As shown in FIGS. 5-6, the display module 18 generally includes several components 20, including a display 22, an optic block 24, a heat sink 26, and a primary PCB 28. A housing 30 at least partially receives the front shield 14, the display module 18, and the rear shield 16, and includes a mounting member 32 extending rearwardly therefrom. The mounting member 32 is adapted for mounting on a windshield of a vehicle.

Referring generally to FIGS. 1-3, the display mirror assembly 10 has a viewing area 40, which includes a front surface 42 of the glass element 12. The viewing area 40 may be a rectangular shape, a trapezoidal shape, or any custom contoured shape desired for aesthetic reasons.

Referring to FIG. 4, the display mirror assembly 10 for a vehicle is shown, with the components partially exploded. The display mirror assembly 10 includes the glass element 12, the front shield 14 and the rear shield 16 encapsulating the display module 18, the rear housing 30, and the mounting member 32. As shown in FIGS. 4-6, the front shield 14, the rear shield 16, and components of the display module 18 include various retaining features to operably connect the several components of the display module 18 with the front shield 14, the rear shield 16 and each other, and to provide support to the display module 18. Specifically, the front shield 14 includes retaining features to operably connect the front shield 14 to the display module 18, and the rear shield 16 has retaining features to operably connect the rear shield 16 to the display module 18. The retaining features generally include snap fit connections, tab and slot connections, screw connections, and other known retaining features. Some or all of the retaining features may also be strengthened by the addition of adhesive compounds. Certain non-limiting illustrative examples of retaining features are described in detail herein.

The display mirror assembly 10 will hereafter be described in greater detail, beginning with the elements closest to the intended viewer, and extending rearwardly away from the viewer.

As shown in FIG. 4, the glass element 12 is generally planar, with an outer perimeter 46 and a border 48 around the outer perimeter 46. The border 48 may incorporate a chrome ring or other similar finish to conceal the front shield 14 and other elements located behind the glass element 12 in the display mirror assembly 10, including without limitation a seal on an electrochromic unit, an applique, foam adhesive, or pad printing. The border 48 may extend from the outer perimeter 46 of the glass element 12 to an outer edge 50 of the display 22. Alternatively, the border 48 may be narrower and not reach from the outer perimeter 46 to the outer edge 50 of the display 22 along at least some portions of the border 48. The perimeter of the glass element 12 may also have a ground edge, a bezeled edge, or be frameless.

The glass element 12 may be an electro-optic element or an element such as a prism. One non-limiting example of an electro-optic element is an electrochromic medium, which includes at least one solvent, at least one anodic material, and at least one cathodic material. Typically, both of the anodic and cathodic materials are electroactive and at least one of them is electrochromic. It will be understood that regardless of its ordinary meaning, the term "electroactive" will be defined herein as a material that undergoes a modification in its oxidation state upon exposure to a particular electrical potential difference. Additionally, it will be understood that the term "electrochromic" will be defined herein, regardless of its ordinary meaning, as a material that exhibits a change in its extinction coefficient at one or more wavelengths upon exposure to a particular electrical potential difference. Electrochromic components, as described herein, include materials whose color or opacity are affected by electric current, such that when an electrical current is applied to the material, the color or opacity change from a first phase to a second phase. The electrochromic component may be a single-layer, single-phase component, multi-layer component, or multi-phase component, as described in U.S. Pat. No. 5,928,572 entitled "Electrochromic Layer And Devices Comprising Same," U.S. Pat. No. 5,998,617 entitled "Electrochromic Compounds," U.S. Pat. No. 6,020,987 entitled "Electrochromic Medium Capable Of Producing A Pre-selected Color," U.S. Pat. No. 6,037,471 entitled "Electrochromic Compounds," U.S. Pat. No. 6,141,137 entitled "Electrochromic Media For Producing A Pre-selected Color," U.S. Pat. No. 6,241,916 entitled "Electrochromic System," U.S. Pat. No. 6,193,912 entitled "Near Infrared-Absorbing Electrochromic Compounds And Devices Comprising Same," U.S. Pat. No. 6,249,369 entitled "Coupled Electrochromic Compounds With Photostable Dication Oxidation States," and U.S. Pat. No. 6,137,620 entitled "Electrochromic Media With Concentration Enhanced Stability, Process For The Preparation Thereof and Use In Electrochromic Devices"; U.S. Patent Application Publication No. 2002/0015214 A1 entitled "Electrochromic Device"; and International Patent Application Serial Nos. PCT/US98/05570 entitled "Electrochromic Polymeric Solid Films, Manufacturing Electrochromic Devices Using Such Solid Films, And Processes For Making Such Solid Films And Devices," PCT/EP98/03862 entitled "Electrochromic Polymer System," and PCT/US98/05570 entitled "Electrochromic Polymeric Solid Films, Manufacturing Electrochromic Devices Using Such Solid Films, And Processes For Making Such Solid Films And Devices," which are herein incorporated by reference in their entirety. The glass element 12 may also be any other element having partially reflective, partially transmissive properties. To provide electric current to the glass element 12, electrical elements 52 are provided on opposing sides of the element, to generate an electrical potential therebetween. A J-clip 54 is electrically engaged with each electrical element 52, and element wires extend from the J-clips 54 to the primary PCB 28.

Now referring to FIGS. 5-6, the front shield 14 functions to shield the display module 18 from radio frequency (RF) electromagnetic radiation and to provide support for the glass element 12 and the display module 18. The front shield 14 is formed from one or more materials which are suitable to block RF radiation, including without limitation steel. As a non-limiting example, the front shield 14 can be formed from a stamped steel material which is about 0.2 mm thick.

Also as shown in FIGS. 5-6, the front shield 14 is generally shaped in the form of a ring 60 having an opening 62 therethrough. The front shield 14 has a front side 64, rear side 66, and an outer surface 68 which is generally coextensive with the outer perimeter 46 of the glass element 12. The front shield 14 includes retaining features 70 extending forwardly therefrom, to mechanically engage the glass element 12. An adhesive, such as a foam adhesive 72, may also be used to secure the glass element 12 to the front shield 14. The front shield 14 further includes rearwardly directed tabs 74 to operably engage the rear shield 16 (or a component of the display module 18). The rearwardly directed tabs 74 further include holes 76 therethrough, to operably engage at least one component of the display module 18, such as the optic block 24.

As best shown in FIG. 6, the display module 18 is disposed behind the front shield 14, with the display 22 viewable through the opening 62 in the front shield 14. The components of the display module 18 are ordered, from the front shield 14 toward the rear shield 16, the display 22, the optic block 24, the heat sink 26, and the primary PCB 28.

The display 22 is generally planar, with the outer edge 50 defining a front surface 78. The front surface 78 of the display 22 can be shaped to correspond to and fit within the shape of the viewing area 40 of the display mirror assembly 10. Alternatively, the display 22 may have a front surface 78 which fits within, but is not complementary to the viewing area 40, for example, where the front surface 78 of the display 22 is generally rectangular and the front surface 42 of the glass element 12 has a contoured outer perimeter 46. The distance between the outer edge 50 of the display 22 and the outer perimeter 46 of the glass element 12 is about 9 mm or less along at least a portion of the outer edge 50. In one embodiment, the display 22 has a viewable front surface 78 area which is about 56% to about 70% of the viewing area 40 of the glass element 12.

The display 22 may be LCD, LED, OLED, plasma, DLP or other display technology. The display 22 further includes a flexible electrical connector 80 which is operably mechanically and electrically connected with the primary PCB 28. The flexible electrical connector 80 has a length L which is sufficient to wrap around the display module 18 components between the display 22 and the primary PCB 28, and has a width which extends substantially along a top edge 82 of the display 22. The flexible electrical connector 80, when operatively connected to the primary PCB 28, aids in securing the components along a top edge of the display module 18.

As shown in FIGS. 5-6, the optic block 24 includes a front side 90 which is facing the display 22, a rear side 92 which is facing the heat sink 26, and an outer perimeter 94. The optic block 24 further includes tabs 96 extending generally outwardly therefrom around at least a portion of the outer perimeter 94. The tabs 96 are received through the holes 76 in the rearwardly directed tabs 74 of the front shield 14, to operably mechanically engage the optic block 24 with the front shield 14. The optic block 24 further includes at least one screw-receiving element 98 on the rear side 92 thereof. The screw-receiving element 98 is adapted to engage a screw 100 threaded through the rear shield 16 and the display module 18 components between the optic block 24 and the rear shield 16. In alternate embodiments, the tabs 96 for engaging the front shield 14, the screw-receiving elements 98, or both, could be provided on different components of the display module 18.

As shown in FIGS. 4 and 6, a glare sensor 102 is provided on the front side 90 of the optic block 24, in a location which receives light through the glass element 12, and which is not behind the display 22. The glare sensor 102 is snap-fit into a receiving aperture 104 in the optic block 24. The glare sensor 102 receives light from headlamps of a trailing vehicle, and measures information regarding the likely glare visible on the glass element 12 and communicates this information to the display mirror assembly 10 so that the display mirror assembly 10 can be optimized to allow viewing of the display 22 through the glass element 12. The glare sensor's 102 optical vertical/horizontal pattern is symmetrical, so that orientation of the glare sensor 102 is not significant. The glare sensor 102 could also be packaged at least partially within the housing 30 of the display mirror assembly 10 and have a light guide which is configured to propagate light to the glare sensor 102. The glare sensor 102 could also be an imager on a rear portion of the vehicle, wherein a signal representative of the received light is communicated from the glare sensor 102 to the display mirror assembly 10.

As shown in FIGS. 5-6, the heat sink 26 is disposed rearwardly from the optic block 24, and dissipates heat generated by the primary PCB 28 and other components of the display module 18. The heat sink 26 has a generally planar body 110 with a front side 112 and a top edge 114. A channel 116 extends along the top edge 114 of the heat sink 26, and defines a forward-facing opening 118. An edge lit PCB 120 and a gap filler 122 are disposed partially within the channel 116, with the edge lit PCB 120 extending generally perpendicularly from the heat sink 26 in a forward direction, and having an operable side which is facing downward, away from the top edge 114. The edge lit PCB 120 includes a wiring adapted for electrical connection with the primary PCB 28, to permit electrical power and signals to be supplied to the edge lit PCB 120. A plurality of tabs 128 extend upwardly from the top edge 114 of the heat sink 26, for mechanical engagement with the rear shield 16.

The heat sink 26 also includes at least one hole 130 therethrough to receive a screw 100 threaded from the rear shield 16 to the optic block 24. The screw-receiving element 98 of the optic block 24 is optionally raised, to extend through the hole 130 in the heat sink 26 and receive the screw 100. The screw-receiving element 98 of the optic block 24 may also aid in alignment of display module 18 components during manufacturing and will provide additional reinforcement to the display module 18 in the interaction between components if it is raised.

The primary PCB 28 operates to provide electrical power and control for the components of the display module 18 and for the glass element 12. As shown in FIGS. 5-6, the primary PCB 28 is generally planar, with a front side 140, a rear side 142, and side edges 144. The front side 140 is facing the heat sink 26 and the rear side 142 is facing the rear shield 16. Electrical components are generally oriented on the rear side 142 of the primary PCB 28. The primary PCB 28 includes an electrical connector for operable electrical engagement with the electrical element wires of the glass element 12, an electrical connector for operable electrical engagement with the flexible electrical connector 80, and an electrical connector for operable electrical engagement with the wiring harness. Additional functional elements that may be provided on the display mirror assembly 10 may also be electrically connected to the primary PCB 28, such as the glare sensor 102 and any other functional buttons or features of the display mirror assembly 10. The primary PCB 28 further includes side cutouts 150 along the side edges 144, to permit passage of the screws 100 used to secure the rear shield 16 to the components of the display module 18.

The rear shield 16 functions to shield the display module 18 from RF radiation. As best shown in FIGS. 4-5, the rear shield 16 also serves to encapsulate the display module 18, and further interlock the components of the display mirror assembly 10. The rear shield 16 is formed from a material which is suitable to block such radiation and provide the desired support for the display mirror assembly 10, such as steel. As a non-limiting example, the rear shield 16 can be formed from stamped steel with a thickness of about 0.381 mm.

As shown in FIG. 6, the rear shield 16 includes a rear wall 160 having an outer perimeter 162, and a peripheral wall 164 extending forwardly from the rear wall 160 about at least a portion of the outer perimeter 162. The peripheral wall 164 has slots 166 therein, which correspond to the upstanding tabs 128 along the top edge 114 of the heat sink 26 and are operably mechanically engageable therewith. The rear shield 16 further includes at least one hole 168 therethrough to accommodate the screw 100, where the screw 100 extends through the rear shield 16 and into the components of the display module 18 to secure the rear shield 16 to the display module 18. The screw 100 extends through the rear wall 160 of the rear shield 16, through the side cutouts 150 of the primary PCB 28, through the heat sink 26, and is secured to the screw-receiving element 98 on the rear side 92 of the optic block 24.

The rear housing 30 includes a forwardly directed cavity 170, into which all or a portion of the front shield 14, rear shield 16, and the display module 18 supported therebetween are inserted. The rear housing 30 includes mechanically engaging features 172 which snap fit with corresponding engagement features 174 located on the peripheral wall 164 of the rear housing 30 or on a display module 18 component such as the heat sink 26. The mounting member 32 is operably engaged with the rear housing 30 in any known manner.

With respect to the following description, the display mirror assembly 10 is considered "on axis" when a line perpendicular to the plane of the glass element 12 extends toward the eyes of a viewer. Due to the display 22 being viewed through the glass element 12, any glare on the glass element 12 may interfere with the visibility of the display 22. When the display mirror assembly 10 is on axis and is being used during night time driving conditions, headlights from a trailing vehicle (i.e., a vehicle driving behind the vehicle with the display mirror assembly 10) can cause a glare which is visible to the driver. According to one embodiment of the present invention, an actuator device 176, as shown in FIGS. 2 and 6, is operably coupled to the display mirror assembly 10. When actuated, the actuator device 176 moves at least the glass element 12 off axis (i.e., away from a direct line toward the driver's eyes). Typically, actuation of the actuator device 176 tilts the glass element 12 upwards, to move the mirror to an off-axis position. However, it should be appreciated that the actuator device 176 can be configured to move the mirror in any direction with respect to the axis. The actuator device 176 can also be configured to move the display 22 upon activation. The actuator device 176 can also be configured to turn the display 22 on or off. Thus, when the actuator device 176 is actuated to move the mirror off axis, the display 22 can be turned off.

Additionally, to provide information to the viewer of the display mirror assembly 10, the display mirror assembly 10 may include information regarding the field of view 178, such as a partially transmissive graphic overlay or an image on the display 22 visible on the viewing area 40 when the display mirror assembly 10 is in use.

In order to construct the display mirror assembly 10 described herein, the J-clips 54 are installed on the glass element 12, and then element wires are soldered to the top portion of the J-clips 54. The glass element 12 is then secured to the front side 64 of the front shield 14, using the foam adhesive 72 and the forward retaining features 70 of the front shield 14. The front shield 14 is then inverted, with the glass element 12 facing downwardly on a protective surface.

A first subassembly 180 (FIG. 5), including the display 22 and optic block 24, is assembled by snap-fitting the glare sensor 102 into the receiving aperture 104 in the optic block 24, and adhering the display 22 to the optic block 24. The adhesion of the display 22 and optic block 24 may include coating the front side 90 of the optic block 24 with an adhesive and applying a release liner over the adhesive, wherein the release liner is easily removable from the adhesive. When it is time to assemble the display 22 and optic block 24, the release liner is removed, and the display 22 is positioned on the front side 112 of the optic block 24. To position the display 22, one edge of the display 22 is aligned in the appropriate location on the optic block 24, and then the display 22 is rotated into contact with the front side 90 of the optic block 24. The first subassembly 180 is placed in position on the rear side 66 of the front shield 14. The tabs 96 extending outwardly from the optic block 24 are inserted through the holes 76 in the rearwardly directed tabs 74 of the front shield 14.

A second subassembly 182 (FIG. 5), including the heat sink 26 and edge lit PCB 120, is assembled. To assemble the second subassembly 182, the gap filler 122 is adhered to the edge lit PCB 120. The adhesion may include coating one side of the gap filler 122 with adhesive and then applying the gap filler 122 to the edge lit PCB 120 so that it does not interfere with the operable side of the edge lit PCB 120. The gap filler 122 and edge lit PCB 120 are then inserted into the opening in the channel 116 on the front side 112 of the heat sink 26. Locating features are optionally provided on the heat sink 26, the edge lit PCB 120 or both, to aid in inserting the side lit PCB and gap filler 122 into the channel 116. The second subassembly 182 is placed in position on the rear side 92 of the optic block 24. The screw-receiving elements 98 extending rearwardly from the optic block 24 extend through the holes 130 in the heat sink 26.

The primary PCB 28 is placed above the top edge of the second subassembly 182, with the front side 140 facing upwards. The flexible electrical connector 80 from the display 22 is mated with the electrical connector therefor. The primary PCB 28 is then rotated 180 degrees about the top edge of the second subassembly 182, so that the front side 140 is in contact with the heat sink 26. When rotating the primary PCB 28, the flexible electric connector is wrapped over the top edge of at least a portion of the display module 18. The element wires are electrically connected with the electrical connectors therefor, and the wiring harness for the edge lit PCB 120 is connected with the electrical connector therefor.

As shown in FIGS. 4-5, the rear shield 16 is placed over the primary PCB 28, and the tabs 128 extending upwardly from the heat sink 26 are engaged with the slots 166 on the peripheral wall 164 of the rear shield 16. At least one screw 100 is inserted through the screw holes 168 in the rear shield 16, through the side cutouts 150 in the PCB, through the heat sink 26, and into the screw-receiving elements 98 on the optic block 24. It is desirable that two to three screws 100 are affixed in this manner.

The forwardly directed cavity 170 of the rear housing 30 is placed over the rear shield 16, and the mechanically engaging features 172 of the rear housing 30 are snap fit to engage with the corresponding engagement feature 174 of the heat sink 26. The mounting member 32 may be installed in the rear housing 30 prior to assembly.

The present invention may be used with a mounting system such as that described in U.S. Pat. Nos. 8,201,800; 8,210,695; U.S. patent application Ser. Nos. 13/600,496; 13/527,375; 13/431,657; 13/402,701; 12/187,019, and U.S. Provisional Patent Application Nos. 61/709,716; 61/707,676; and 61/704,869, which are hereby incorporated herein by reference in their entirety. Further, the present invention may be used with a rearview packaging assembly such as that described in U.S. Pat. No. 8,264,761; U.S. patent application Ser. Nos. 13/567,363; 13/405,697; 13/402,701; and Ser. No. 13/171,950, and U.S. Provisional Patent Application Nos. 61/707,625; and 61/590,259, which are hereby incorporated herein by reference in their entirety. Additionally, it is contemplated that the present invention can include a bezel such as that described in U.S. Pat. Nos. 8,201,800; 8,210,695; and U.S. patent application Ser. No. 13/271,745, which is hereby incorporated herein by reference in its entirety.

A display mirror assembly according to the present disclosure has several advantages. The display module is supported by the front shield and rear shield, and does not require a separate support or carrier plate. Omission of a carrier plate, and inclusion of retaining features in the front shield and rear shield, permits the display mirror assembly to be lighter, involve less parts for manufacturing, and to have a display which is viewable over a larger percentage of the total viewing area of the display mirror assembly.

It will be appreciated that embodiments of the invention described herein may be comprised of one or more conventional processors and unique stored program instructions that control one or more processors to implement, in conjunction with certain non-processor circuits, some, most, or all of the functions of a display mirror assembly 10, as described herein. The non-processor circuits may include, but are not limited to signal drivers, clock circuits, power source circuits, and/or user input devices. As such, these functions may be interpreted as steps of a method used in using or constructing a classification system. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, the methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

It will be understood by one having ordinary skill in the art that construction of the described invention and other components is not limited to any specific material. Other exemplary embodiments of the invention disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the invention as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present invention. The exemplary structures and processes disclosed herein are for illustrative purposes and are not to be construed as limiting.

It is also to be understood that variations and modifications can be made on the aforementioned structures and methods without departing from the concepts of the present invention, and further it is to be understood that such concepts are intended to be covered by the following claims unless these claims by their language expressly state otherwise.

What is claimed is:

1. A display mirror assembly for a vehicle, comprising:
   a front shield having a first side and a second side, wherein a partially reflective, partially transmissive element is mounted on the first side;
   a rear shield disposed behind the front shield;
   a display module mounted between the front shield and the rear shield and including in order from the front shield:
   a display;
   an optic block;
   a heat sink having an edge lit PCB mounted along a top edge thereof; and
   a PCB, wherein the front shield is secured to at least one component of the display module with a first retaining feature and the rear shield is secured to at least one component of the display module with a second retaining feature; and
   a housing which at least partially surrounds the front shield, display module, and rear shield.

2. The display mirror assembly of claim 1, wherein the first retaining feature operatively engages the front shield with the optic block, and wherein the second retaining feature operatively engages the rear shield with the heat sink and the optic block.

3. The display mirror assembly of claim 1, wherein the partially reflective, partially transmissive element is an electrochromic member.

4. The display mirror assembly of claim 3, wherein the edge of the partially reflective, partially transmissive element has a chrome ring edge treatment.

5. The display mirror assembly of claim 4, wherein the distance from an outer edge of a front face of the partially reflective, partially transmissive element to an outer edge of a front face of the display module is less than about 9 mm.

6. The display mirror assembly of claim 1, wherein the display has a shape which corresponds to the shape of the partially reflective, partially transmissive element, and wherein the display is an LCD, LED, OLED, plasma, or DLP display element.

7. The display mirror assembly of claim 1, further comprising a glare sensor optic engaged with the optic block.

8. The display mirror assembly of claim 1, further comprising a partially transmissive graphic overlay which provides information to a viewer regarding the field of view shown in the display mirror assembly.

9. The display mirror assembly of claim 1, wherein the display module is capable of displaying an image which provides information to a viewer regarding the field of view shown in the display mirror assembly.

10. The display mirror assembly of claim 1, wherein the PCB is operably coupled with an external button disposed on the housing.

11. The display mirror assembly of claim 1, wherein the front shield is constructed from a metallic material and is configured to support the display module and rear shield without the aid of a carrier plate.

12. An RF shield for a display mirror, comprising:
a first metallic shield member that has RF shielding properties and forms a carrier plate having structural features configured to support a display module; and
a second metallic shield member with RF shielding properties, wherein the first metallic shield member and the second metallic shield member each have retaining features to operatively engage the display module disposed between the first metallic shield member and the second metallic shield member.

13. The RF shield for a display mirror of claim 12, wherein the first metallic shield member is a front shield and wherein the front shield has a set of retaining tabs for engagement with the display module.

14. The RF shield for a display mirror of claim 13, wherein the second metallic shield is a rear shield, and wherein the rear shield has a plurality of screw holes therethrough, and a plurality of screws extend through the screw holes and secure the rear shield to the display module.

15. The RF shield of claim 13, wherein the front shield further includes forwardly extending peripheral retaining features configured to secure a partially reflective, partially transmissive element thereto.

16. A method of manufacturing a display mirror assembly for a vehicle, comprising the following steps:
affixing a partially reflective, partially transmissive element to a front side of a front shield;
positioning a display module on a rear side of the front shield and operably securing the front shield to the display module;
positioning a rear shield on a rear side of the display module and operably securing the rear shield to the display module; and
operably securing the front shield, display module, and rear shield between a glass element and a rear housing in a carrier plate free configuration.

17. The display mirror assembly manufacturing process of claim 16, wherein the step of positioning the display module on the rear side of the front shield includes the steps of:
positioning a display subassembly adjacent the rear side of the front shield, wherein the display subassembly includes a display and an optic block, wherein the display is adjacent the front shield and includes a flexible electrical connector which extends from a top portion thereof;
positioning a heat sink on a rear side of the display subassembly; and
operably engaging the flexible electrical connector to a primary PCB and positioning the primary PCB on the rear side of the heat sink.

18. The display mirror assembly manufacturing process of claim 17, wherein the flexible electrical connector extends substantially along the length of the top portion of the display, and wherein the step of operably engaging the flexible electrical connector to the primary PCB includes the step of:
at least partially enclosing a top edge of the display module with the flexible electrical connector.

19. The display mirror assembly manufacturing process of claim 17, further including the steps of:
positioning an edge lit PCB having a wiring harness along a top edge of the heat sink, extending forwardly over a top edge of at least a portion of the display subassembly; and
operably engaging the wiring harness with the primary PCB.

20. The display mirror assembly manufacturing process of claim 17, wherein the partially reflective, partially transmissive element includes an electrochromic assembly, and further including the step of:
operably electrically engaging the electrochromic assembly with the primary PCB.

\* \* \* \* \*